US010781533B2

(12) United States Patent
Samir

(10) Patent No.: US 10,781,533 B2
(45) Date of Patent: Sep. 22, 2020

(54) BATCH PROCESSING CHAMBER

(71) Applicant: Applied Materials, Inc., Santa Clara, CA (US)

(72) Inventor: Mehmet Tugrul Samir, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 276 days.

(21) Appl. No.: 15/172,391

(22) Filed: Jun. 3, 2016

(65) Prior Publication Data

US 2017/0029976 A1 Feb. 2, 2017

Related U.S. Application Data

(60) Provisional application No. 62/199,907, filed on Jul. 31, 2015.

(51) Int. Cl.
| | | |
|---|---|---|
| C30B 25/14 | (2006.01) | |
| C30B 25/10 | (2006.01) | |
| C23C 16/46 | (2006.01) | |
| C23C 16/455 | (2006.01) | |
| C30B 25/12 | (2006.01) | |

(52) U.S. Cl.
CPC .......... *C30B 25/14* (2013.01); *C23C 16/4558* (2013.01); *C23C 16/46* (2013.01); *C30B 25/105* (2013.01); *C30B 25/12* (2013.01)

(58) Field of Classification Search
None
See application file for complete search history.

(56) References Cited

U.S. PATENT DOCUMENTS

| | | | | |
|---|---|---|---|---|
| 5,525,160 A | * | 6/1996 | Tanaka | C23C 16/4401 118/728 |
| 5,730,802 A | * | 3/1998 | Ishizumi | C23C 16/303 118/719 |
| 7,232,502 B2 | * | 6/2007 | Iizuka | C23C 16/4412 118/728 |
| 7,247,207 B2 | * | 7/2007 | Makino | H01L 21/67017 118/719 |
| 2003/0124820 A1 | * | 7/2003 | Johnsgard | C23C 16/455 438/482 |

(Continued)

FOREIGN PATENT DOCUMENTS

KR 101381181 B1 4/2014

OTHER PUBLICATIONS

International Search Report and Written Opinion for Application No. PCT/US2016/039035 dated Sep. 30, 2016 (12 total pages).

(Continued)

*Primary Examiner* — Karla A Moore
(74) *Attorney, Agent, or Firm* — Patterson + Sheridan LLP

(57) ABSTRACT

Embodiments of the present disclosure provide a processing chamber with a top, a bottom, and a sidewall coupled together to define a volume, a gas distributor disposed around the sidewall, a substrate support disposed in the enclosure, the substrate support having a central exhaust opening having a channel and a rotary actuator disposed along a longitudinal axis thereof, and a plurality of substrate pockets distributed around the central exhaust opening, and an energy source coupled to the bottom.

20 Claims, 6 Drawing Sheets

(56) References Cited

U.S. PATENT DOCUMENTS

| | | | |
|---|---|---|---|
| 2009/0165713 A1* | 7/2009 | Kim | C23C 16/4412 |
| | | | 118/719 |
| 2010/0055351 A1* | 3/2010 | Kato | C23C 16/45521 |
| | | | 427/595 |
| 2011/0100489 A1 | 5/2011 | Orito et al. | |
| 2011/0232569 A1* | 9/2011 | Olgado | C23C 16/54 |
| | | | 118/719 |
| 2014/0044889 A1 | 2/2014 | Qi et al. | |
| 2014/0199056 A1* | 7/2014 | Chang | H01L 21/67115 |
| | | | 392/416 |
| 2014/0330422 A1 | 11/2014 | Ranish | |
| 2016/0197001 A1* | 7/2016 | Samir | C23C 16/44 |
| | | | 118/623 |

OTHER PUBLICATIONS

Taiwan Office Action for Application No. TW 105122367 dated Dec. 25, 2019.

\* cited by examiner

BATCH PROCESSING CHAMBER

CROSS-REFERENCE TO RELATED APPLICATION

This application claims priority to U.S. Provisional Application Ser. No. 62/199,907, filed Jul. 31, 2015, which application is hereby incorporated by reference herein.

FIELD

Embodiments of the present disclosure generally relate to methods and apparatus for semiconductor processing. More specifically, embodiments described herein relate to methods and apparatus for performing epitaxy on a plurality of substrates simultaneously.

BACKGROUND

Epitaxy is a process that involves chemical addition of material to a surface in layers. Such processes are common in semiconductor processing, where they are used for building certain components of logic and memory devices. In a typical process for making a logic device, a silicon layer is grown epitaxially on a substrate to provide an ordered crystal structure. This silicon layer typically becomes the channel component of the transistor.

Epitaxy is a slow process and is typically performed on a single substrate in a chamber. In today's most advanced manufacturing facilities, an epitaxy process typically takes about an hour to process a 300 mm circular substrate.

There is a need to increase throughput in epitaxy processes by processing a plurality of substrates.

SUMMARY

Embodiments of the present disclosure provide a processing chamber with a top, a bottom, and a sidewall coupled together to define a volume, a gas distributor disposed around the sidewall, a substrate support disposed in the enclosure, the substrate support having a central exhaust opening having a channel and a rotary actuator disposed along a longitudinal axis thereof, and a plurality of substrate pockets distributed around the central exhaust opening, and an energy source coupled to the bottom.

Also disclosed is a processing chamber with a top, a bottom, and a sidewall coupled together to define a volume, a gas distributor disposed around the sidewall, a substrate support disposed in the volume, the substrate support having a central exhaust opening having a channel and a rotary actuator disposed along a longitudinal axis thereof, and a plurality of substrate pockets distributed around the central exhaust opening, a reflector plate disposed on the top facing the substrate support, and an energy source coupled to the bottom.

Also disclosed is a processing chamber with a top, a bottom, and a sidewall coupled together to define a volume, a gas distributor disposed around the sidewall, a substrate support disposed in the volume, the substrate support having a central exhaust opening having a channel and a rotary actuator disposed along a longitudinal axis thereof, and a plurality of substrate pockets distributed around the central exhaust opening, a reflector plate disposed on the top facing the substrate support, and an energy source coupled to the bottom, the energy source comprising a housing containing a plurality of lamps.

BRIEF DESCRIPTION OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In this disclosure, the terms "top", "bottom", "side", "above", "below", "up", "down", "upward", "downward", "horizontal", "vertical", and variants thereof do not refer to absolute directions. Instead, these terms refer to directions relative to a basis plane of a chamber, for example a plane parallel to a substrate processing surface of the chamber. A directional inset is included in some of the Figures to aid the reader with directional orientations.

Figure 1:
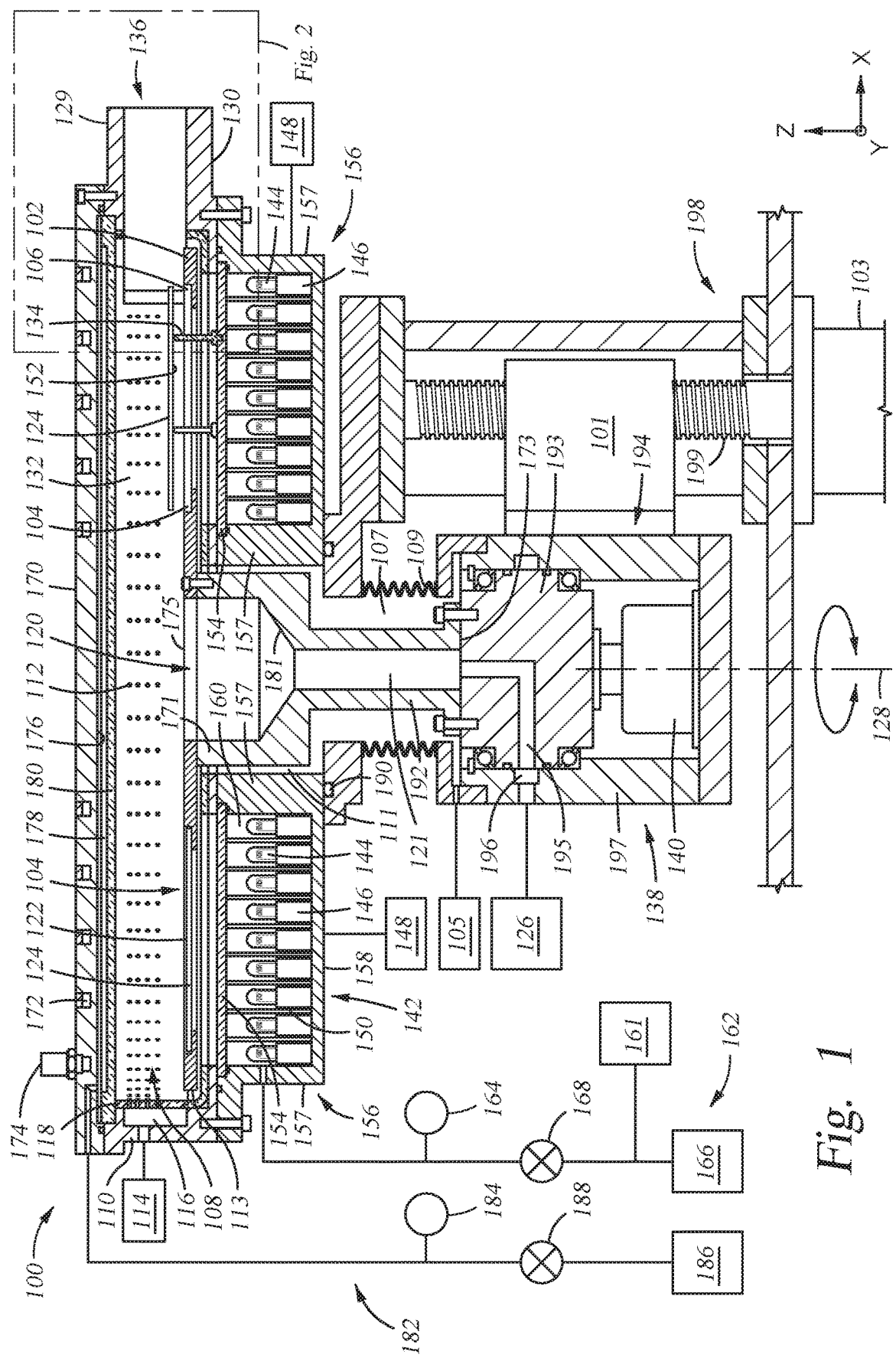
FIG. 1 is a cross-sectional view of a processing chamber according to one embodiment.

FIG. 1 is a cross-sectional view of a processing chamber 100 according to one embodiment. The processing chamber 100 generally features a substrate support 102 having multiple substrate receiving locations 104. The substrate receiving locations 104 may be configured as pockets 106 in one embodiment. The processing chamber 100 also generally features a gas distributor 108 around a sidewall 110 of the processing chamber 100. The gas distributor 108 includes a plurality of gas passages 112 disposed about a circumference of the sidewall 110. Processing gases are supplied from a gas source 114 and to a circumferential channel 116 formed between the sidewall 110 and a body 118 of the gas distributor 108. Processing gases flow from the circumferential channel 116 and are evenly distributed through the gas passages 112. Excess processing gases are then exhausted through a central exhaust opening 120 in a manner that provides uniform gas flow and exposure across a processing surface 122 of a substrate 124 disposed on the substrate support 102. The central exhaust opening 120 of the substrate support 102 is coupled to a vacuum pump 126 and a conductance path (described in more detail below), primarily along a longitudinal axis 128 of the processing chamber 100, is provided. The central exhaust opening 120 comprises a central exhaust channel 121 that is coupled to the substrate support 102.

The chamber 100 has a top 129 and a bottom 130 that, together with the sidewall 110, define an interior volume 132 of the processing chamber 100. The substrate support 102 is disposed within the interior volume 132. The substrate support 102 is shown in a substrate transfer position such that a substrate 124 is supported on lift pins 134. The lift pins 134 may be made of a transparent material, such as quartz, sapphire or silicon carbide (SiC). In the transfer position, the substrate 124 is spaced away from the pocket 106 and an end effector (not shown) may enter the interior volume 132 through a transfer port 136. A substrate may either be transferred into or out of the processing chamber 100 via the transfer port 136. The transfer port 136 may be selectively sealed by a slit valve (not shown). The substrate support 102 is coupled to a movement mechanism 138 that moves the substrate support 102 up and down (in the Z direction) within the interior volume 132. The movement mechanism 138 also provides rotation of the substrate support 102 about the longitudinal axis 128.

During processing, the movement mechanism 138 raises the substrate support 102 such that the substrate 124 is received in the pocket 106 and is clear of the lift pins 134. Thereafter, the substrate support 102 may be rotated by a rotary actuator 140 coupled to the substrate support 102. The rotary actuator 140 as well as the movement mechanism 138 is located outside of the interior volume 132 of the processing chamber 100. The lowermost holes 112 may be positioned such that an edge of any hole 112 of the lowermost holes 112 includes a distance from the upper surface of the substrate support 102. The distance may be from about 0 microns (μm) to about 100 μm, such as about 10 μm to about 50 μm, for example 20 μm. The distance may be utilized to smooth the flow of processing gases across the upper surface of the substrate support 102. After processing of multiple substrates 124 in the pockets 106, one pocket 106 may be aligned with the lift pins 134. The substrate support 102 is lowered to the position shown in FIG. 1 and the substrate 124 may be transferred out of the processing chamber 100. Another unprocessed substrate may be introduced into the processing chamber 100 by placement on the lift pins 134. The substrate support 102 may then be raised to remove the unprocessed substrate from the lift pins 134, and the substrate support 102 may be rotated to align another pocket 106 with the lift pins 134. A transfer process may then take place to remove the processed substrate and introduce another substrate therein. The substrate support 102 may be raised and rotated again to align another pocket with the lift pins 134 for a substrate transfer process. The rotation, alignment, lowering, transfer, and lifting of the substrate support 102 (substrate transfer movements) may be repeated, as necessary, so that all processed substrates are replaced with unprocessed substrates. Thereafter, processing of the multiple unprocessed substrates may proceed in the processing chamber 100.

In some embodiments, a substrate may be transferred to the substrate support 102 and the substrate support 102 is raised to a processing position. The substrate support 102 may then be rotated and processing gas may be provided from the gas distributor 108. The rotation may be provided for about 30 seconds to about 3 minutes. The processing gas may then be stopped and the substrate support 102 may be rotated and aligned with the lift pins 134. The substrate support 102 may then be lowered to remove the substrate from the pocket 106 of the substrate support 102 for transfer. In some embodiments, substrates may be added and removed one at a time with processing in-between transfer. In other embodiments, when multiple substrates are processed, the substrate support 102 may be rotated and lowered as described above to transfer a processed substrate out of the processing chamber 100 and an unprocessed substrate is transferred into the processing chamber 100. The substrate support 102 may then be raised and rotated about 60 degrees (when the substrate support 102 includes 6 pockets) in order to unload a processed substrate and load an unprocessed substrate.

Coupled at the bottom 130 of the processing chamber 100 is an energy source 142 that projects energy into the interior volume 132 toward the substrate support 102. The energy source 142 may be a radiant source, a thermal source, or a plasma source. Radiant sources may include ultraviolet (UV), infrared (IR), as well as visible frequency lamps, lasers, and LED's, or combinations thereof. Thermal sources may be lasers, LED's, and filament lamps, or combinations thereof. Plasma sources may be capacitive, inductive, or a combination thereof. The processing chamber 100 is shown with an energy source 142 that has a plurality of lamps 144. In this case, the lamps 144 are arranged along a plane generally parallel to the processing surface 122 of the substrates 124 and oriented radially. Each lamp 144 includes a power connection 146 that is coupled to a power source 148. The power source 148 may control the lamps 144 collectively or independently.

The lamps 144 may be oriented in any convenient way. The lamps 144 may be oriented vertically in rows, for example, or columns. Alternately, lamps may be oriented horizontally. The energy source 142 may have reflective internal surfaces to increase the efficiency of power delivery to the substrates 124. In one embodiment, each lamp 144 may be disposed in a reflective tube 150 to maximize power delivery from each lamp. The reflective tube 150 may have a reflective coating, which may be a reflective metal, such as gold or platinum, or a reflective dielectric material such as a dielectric mirror or Bragg reflector. Energy from the lamps 144 travels to a backside 152 of the substrates 124 through a transparent plate 154 that forms an upper boundary of the energy source 142. The transparent plate 154 may be quartz, sapphire, or other suitable material. The transparent plate 154 may also include an anti-reflective coating. In the embodiment shown, the energy source 142 is divided into multiple lamp heads 156 described in more detail in FIG. 3.

Each lamp head 156 includes the transparent plate 154, sidewalls 157 and a bottom 158 to define an internal volume 160. The sidewalls 157 and the bottom 158 may comprise stainless steel or aluminum. Dependent on pressure in the interior volume 132 of the processing chamber 100 relative to pressure in the internal volume 160, as well as thickness of the transparent plate(s) 154, the internal volume 160 may be fluidly coupled to a pressure equalization system 162. The pressure equalization system 162 is optional and may be utilized if needed. For example, if the transparent plate 154 on each lamp head 156 is thick enough to withstand negative pressures in the interior volume 132 of the processing chamber 100, the internal volume 160 may have a pressure substantially equal to ambient (atmospheric) pressure. In contrast, if the pressure in the interior volume 132 of the processing chamber 100 may bow or break the transparent plate 154, the pressure equalization system 162 may be used to lower the pressure in the internal volume 160. The pressure equalization system 162 may include a gauge 164 to determine pressures in the internal volume 160. A vacuum pump 166 may be part of the pressure equalization system 162 to lower pressure in the internal volume 160. A valve 168 may be used to control pressure in the internal volume 160. The pressure equalization system 162 may also be utilized to cool the lamp head 156. For example, the pressure equalization system 162 may be coupled to a fluid source 161 that may flow a coolant to the internal volume 160. The coolant may be nitrogen, helium or some other heat transfer medium.

A reflector plate 170 may be coupled to the top 129. The reflector plate 170 may be made of aluminum or stainless steel. The reflector plate 170 may include a channel 172 formed in a body of the reflector plate 170, which may be used to flow a fluid, such as a coolant, through or along the reflector plate 170. An inlet 174 and an outlet (not shown) may be coupled to the reflector plate 170 to circulate the fluid to the channel 172. The reflector plate 170 includes a reflective surface 176 disposed on a side of the reflector plate 170 facing the interior volume 132 of the processing chamber 100. The reflective surface 176 is utilized to reflect or redirect radiant energy from the energy source 142, or emitted by the substrates 124 or the substrate support 102, toward the processing surface 122 of a substrate 124 disposed on the substrate support 102. The reflective surface 176 may be a mirror-polished surface, or consist of a reflective material such as gold, platinum or a dielectric material.

In some embodiments, the reflector plate 170 includes a channel 178 formed between the reflective surface 176 and a transparent plate 180. The channel 178 is fluidly coupled to a pressure equalization system 182. As the surface area of the transparent plate 180 is much greater than a surface area of the transparent plates 154 of the lamp heads 156, the pressure in the interior volume 132 of the processing chamber 100 may bow or break the transparent plate 180. The pressure equalization system 182 may be used to lower the pressure in the channel 178. The pressure equalization system 182 may include a gauge 184 to determine pressures in the channel 178. A vacuum pump 186 may be part of the pressure equalization system 182 to lower pressure in the channel 178. A valve 188 may be used to control pressure in the channel 178.

The movement mechanism 138 may be coupled to the lamp heads 156. An o-ring 190 may be used to provide a seal therebetween. The movement mechanism 138 includes a hollow shaft 192 coupled to a shaft 193 of a rotary seal 194. The rotary actuator 140 is coupled to the rotatable shaft 193, which rotates the hollow shaft 192 and the substrate support 102 about the longitudinal axis 128. A conductance path for gases from the interior volume 132 of the processing chamber 100 may be provided through the central exhaust opening 120, the central exhaust channel 121 formed in the hollow shaft 192, through a rotatable channel 195 formed in the rotatable shaft 193, and to the vacuum pump 126 via a circumferential channel 196 formed in a stationary housing 197 of the rotary seal 194. The movement mechanism 138 also includes a vertical actuator 198 that may be coupled to the stationary housing 197. The vertical actuator 198 may include a rotatable shaft 199 that is coupled to the stationary housing 197 by a block 101. A motor 103 is coupled to the rotatable shaft 199, which moves the block 101 in the Z direction when the motor 103 is actuated. In this manner, the stationary housing 197, the hollow shaft 192 and the substrate support 102 are moved vertically in the interior volume 132 of the processing chamber 100. The hollow shaft 192 and the rotatable shaft 193 may be made from quartz, SiC, SiC-coated graphite, ceramic, sapphire, or any material resistant to heat and chemistry.

In some embodiments, the hollow shaft 192 has the central exhaust opening 120 at a first end 171 that opposes a second end 173 of the hollow shaft 192. The central exhaust opening 120 thus extends into the processing volume 132 at the first end 171 of the hollow shaft 192. The first end 171 of the hollow shaft 192 is shown terminating at a position coplanar with an upper surface 175 of the substrate support 102. In other embodiments, the central exhaust opening 120 may terminate at a location above the surface 175 of the substrate support 102. The substrate support 102 may alternately be attached to the hollow shaft 192 below a plane of the surface 175 of the substrate support 102.

The substrate support 102 is disposed about the central exhaust channel 121 and is fluidly coupled to the vacuum pump 126. As the hollow shaft 192 rotates, the substrate support 102 rotates by virtue of attachment to the hollow shaft 192. The central exhaust channel 121 may have an angular profile such that the central exhaust channel 121 includes tapered interior sidewalls 181 as shown. Alternatively the profile may be curve gently to smooth gas flow in the central exhaust channel 121. In some embodiments, a purge gas from a purge gas source 105 may be provided to an interior region 107 of the movement mechanism 138. The interior region 107 may be bounded by a bellows 109. The purge gas may be provided to the interior volume 132 of the processing chamber 100 via a space 111 and flow along a bottom of the substrate support 102 and around a perimeter 113 thereof.

Figure 2:
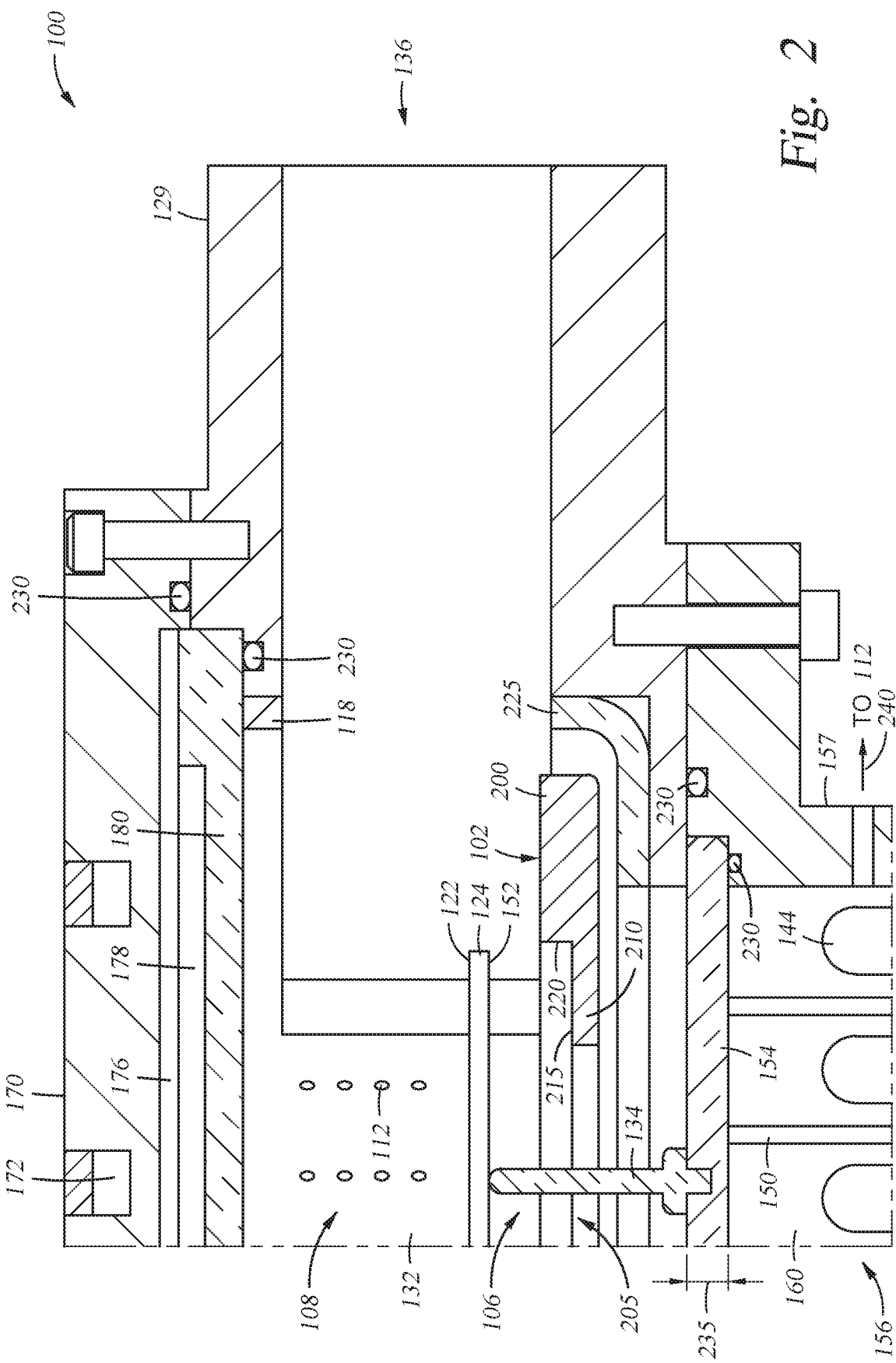
FIG. 2 is an enlarged cross-sectional view of a portion of the processing chamber of FIG. 1.

FIG. 2 is an enlarged cross-sectional view of a portion of the processing chamber 100 of FIG. 1. A portion of the substrate support 102 is as well as the pocket 106. The substrate support 102 includes a body 200 having the pocket 106 formed therein. The body 200 may be formed from silicon carbide (SiC), graphite, or graphite coated with SiC. The pocket 106 may have an opening 205 formed inside of an inwardly extending ledge 210 of the body 200. The opening 205 provides radiant energy from the lamps 144 to impinge the backside 152 of the substrate 124. A substrate receiving surface 215 is provided on an upper surface of the body 200. The substrate 124 may be retained laterally in the pocket 106 by a wall 220 of the body 200. The wall 220 may be orthogonal to the substrate receiving surface 215 in some embodiments. In other embodiments, the wall 220 may be angled or curved relative to the substrate receiving surface 215 such that the wall 220 functions to center the substrate 124 in the pocket 106.

The processing chamber 100 also includes a lower liner 225. In embodiments where the body 108 of the gas distributor 108 does not extend to the transparent plate 180, an upper liner (not shown) that substantially surrounds any exposed internal surfaces of the processing chamber 100. The liner 225 may be transparent quartz, opaque quartz, or other material suitable for high temperature applications. Seals 230, such as elastomeric o-rings, may be utilized to separate volumes of the various components of the processing chamber 100. A portion of the gas passages 112 of the gas distributor 108 are shown in FIG. 2. In some embodiments, the gas passages 112 are circular. However, in other embodiments, the gas passages 112 may be rectangular slots, oval-shaped, or other suitable shape. In addition, the gas passages 112 may be angled relative to the longitudinal axis 128 (shown in FIG. 1). In some embodiments, the gas passages 112 may be angled radially toward the longitudinal axis 128 and orthogonal to the longitudinal axis 128. In other embodiments, the gas passages 112 may be angled relative to the longitudinal axis 128. For example, at least a portion of the gas passages 112 may be angled by about 10 degrees to about 15 degrees relative to the longitudinal axis 128.

As discussed in FIG. 1, the transparent plate 154 of the multiple lamp heads 156 (only one is shown in FIG. 2) may include a thickness 235 that is less than a thickness the transparent plate 180 due to the differences in surface area. The thickness 235 may be less than about 1.0 inches, such as between about 0.5 inches and about 0.75 inches. The decreased surface area of the transparent plates 154 provided by the multiple lamp heads 156 may provide the internal volume 160 of the lamp heads 156 to operate at or near atmospheric conditions. However, if needed, a port 240 may be provided in one of the sidewalls 157 for coupling to the pressure equalization system 162 described in FIG. 1.

Figure 3:
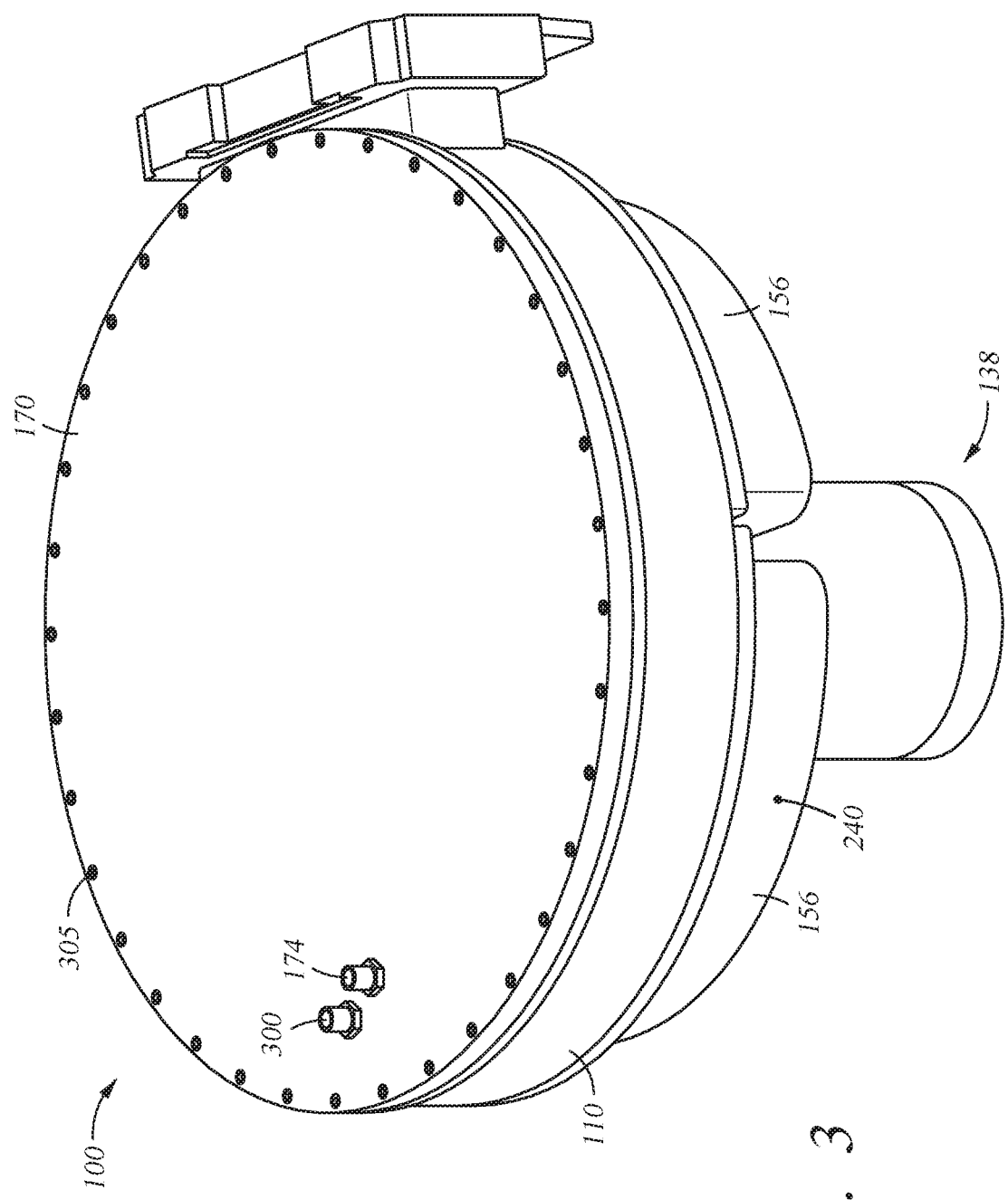
FIG. 3 is an isometric top view of the processing chamber of FIG. 1.

FIG. 3 is an isometric top view of the processing chamber 100 of FIG. 1. The inlet 174 and an outlet 300 are coupled to the reflector plate 170 in order to provide fluids to the coolant channel 172 (shown in FIG. 1). Additionally, fasteners 305 are shown and are utilized to couple the reflector plate 170 to the sidewall 110 of the processing chamber 100.

Figure 4:
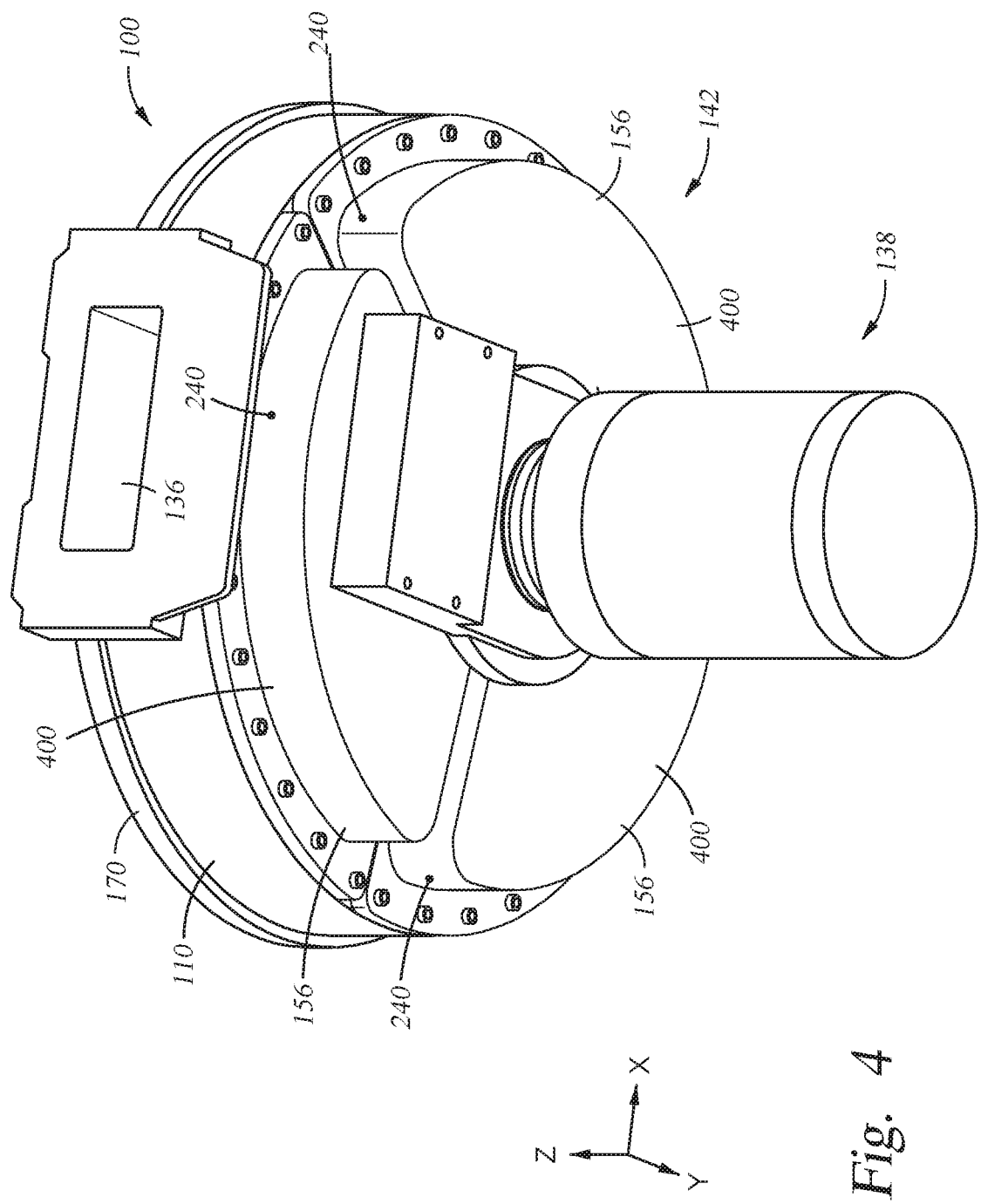
FIG. 4 is an isometric bottom view of the processing chamber of FIG. 1.

FIG. 4 is an isometric bottom view of the processing chamber 100 of FIG. 1. Shown is a portion of the movement mechanism 138 coupled to three lamp heads 156. In one embodiment, each of the lamp heads 156 comprises a housing 400 that is lobe-shaped or arcuate in an X-Y plane. Each of the three transparent plates 154 may have the same shape as the housing 400. Also shown is an optional port 240 formed in the housing 400 if the pressure equalization system 162 (shown in FIG. 1) is needed.

Figure 5:
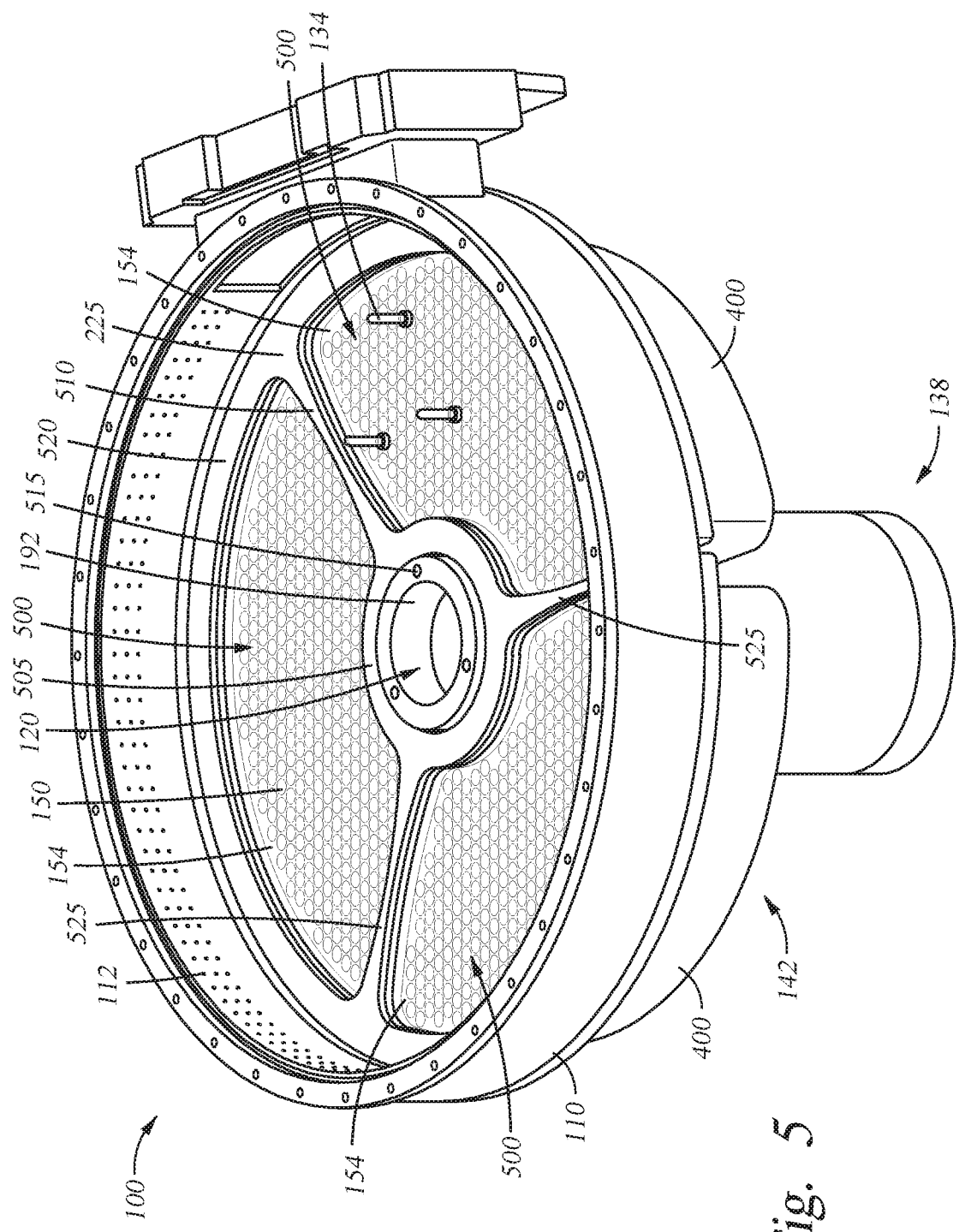
FIG. 5 is an isometric top view of the processing chamber of FIG. 1 with the reflector plate and the substrate support removed.

FIG. 5 is an isometric top view of the processing chamber 100 of FIG. 1 with the reflector plate 170 and the substrate support 102 removed. Clearly shown are three transparent plates 154 and the reflective tubes 150 of the energy source 142. Also shown is the lower liner 225 above the transparent plates 154. An opening 500 is provided within the lower liner 225. In some embodiments, the lower liner 225 includes an inner ring 505 surrounding an upper surface 510 of the hollow shaft 192. The upper surface 510 surrounds the central exhaust opening 120. The upper surface 510 may include one or more interface devices 515 that facilitate alignment and/or coupling of the substrate support 102 (shown in FIGS. 1 and 6) to the hollow shaft 192. The one or more interface devices 515 may be fasteners, such as bolts or screws, openings for receiving a fastener, a pin or other indexing device, or combinations thereof. The lower liner 225 also includes an outer ring 520 that is coupled to the inner ring 505 by one or more spokes 525.

Figure 6:
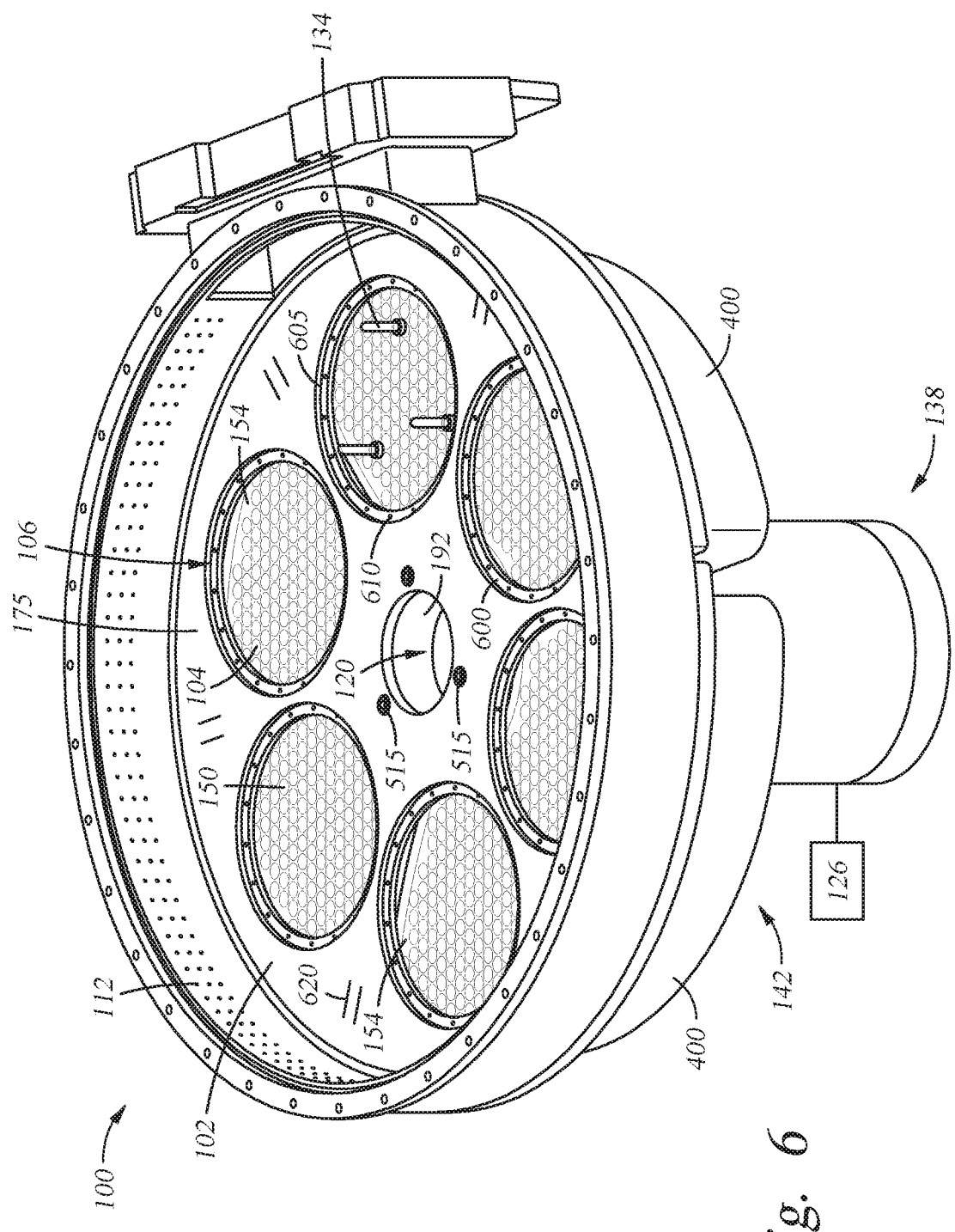
FIG. 6 is an isometric top view of the processing chamber of FIG. 1 with the reflector plate removed.

FIG. 6 is an isometric top view of the processing chamber 100 of FIG. 1 with the reflector plate 170 removed. The substrate support 102 is installed in the processing chamber 100 and coupled to the rotatable hollow shaft 192 by the one or more interface devices 515. As described in FIG. 1, the substrate support 102 may be lifted and lowered by the movement mechanism 138 via the hollow shaft 192. When the substrate support 102 is lifted to clear the lift pins 134, the substrate support 102 may be rotated relative to the housings 400, the transparent plates 154, as well as the lower liner 225 (shown in FIG. 5). Gases from the gas passages 112 may flow radially inward and exhausted to the vacuum pump 126 via the central exhaust channel 121 of the hollow shaft 192.

The pockets 106 are shown as recesses in the upper surface 175 of the substrate support 102. Each of the pockets 106 shown in FIG. 6 includes a ledge 600 for supporting a substrate in each pocket 106. The ledge 600 contacts an edge of the substrate, leaving most of the substrate area exposed to radiation from the lamps (not visible in FIG. 6) passing through the transparent plates 154. The ledges 600 extend radially inward from a wall 605 of each pocket 106. The wall 605 may be vertical (i.e. perpendicular to the upper surface 175 of the substrate support 102). Alternately, the wall 605 may be sloped. The wall 605 may have a straight, curved, or angled profile. The ledge 600 may extend from the wall 605 by any convenient distance. As a fraction of the radius of the pocket 106, the ledge 600 may extend 5% to 10% of the radius. For example, if the radius of the pocket is 150 mm, the ledge may extend about 5 mm to about 15 mm from the wall 605, such as about 8-12 mm, for example about 10 mm. In other embodiments, the pockets 106 may have a floor, rather than a ledge, to support a substrate. The floor may be flat or curved, and may include a thermally emissive material such as silicon carbide or graphite such that the floor functions as a thermal susceptor. In one embodiment, the pocket 106 is a curved dish. In embodiments where the pockets 106 have floors, each floor will have openings to admit the lift pins 134.

The pockets 106 may feature contact minimizing structures to minimize thermally conductive contact between the substrate and the pocket 106. For example, in an embodiment where the pockets 106 have ledges 600, the ledges may include features 610, such as ridges, bumps, and/or grooves to reduce thermally conductive contact between the substrate and the ledge 600. In an embodiment where the pockets 106 include floors, the floor may likewise have ridges, bumps, and/or grooves. In some embodiments, the floor may have vents that prevent movement of the substrates in the pockets 106 when chamber pressure is reduced.

The pockets 106 may be separated by a distance at the points where the pockets 106 are closest to each other. The linear distance, where more than two pockets are used, may be about 1 mm to about 100 mm. Any number of pockets may be used. The susceptor may be sized to accommodate any number of pockets, and multiple ranks, rows, or columns of pockets may be used, as well. In some embodiments, protrusions 620 may be provided on the upper surface 175 of the substrate support 102. The protrusions 620 may be utilized to enhance flow of gases across the substrate support 102 during processing.

While the foregoing is directed to certain embodiments, other and further embodiments may be devised without departing from the basic scope of this disclosure.

What is claimed is:

1. A processing chamber, comprising:
a top, a bottom, and a sidewall coupled together to define a volume;
a gas distributor disposed around the sidewall;
a substrate support disposed in the volume, the substrate support having a central exhaust opening having a channel, and a rotary actuator disposed along a rotational axis of the substrate support, and a plurality of substrate pockets distributed around the central exhaust opening;
a lower liner comprising an inner ring surrounding the central exhaust opening, and an outer ring that is coupled to the inner ring by a plurality of spokes;
a plurality of lift pins fixed on a first transparent plate, each of the plurality of lift pins comprising a transparent material and each lift pin of the plurality of lift pins associated with one of the plurality of substrate pockets, wherein the first transparent plate is fixed relative to the rotational axis of the substrate support; and
a thermal energy source coupled to the bottom.

2. The processing chamber of claim 1, wherein the thermal energy source comprises a lamp assembly containing a plurality of lamps.

3. The processing chamber of claim 2, wherein the lamp assembly comprises three housings, wherein each of the three housings are at least partially separated by one of the plurality of spokes.

4. The processing chamber of claim 3, wherein the three housings are substantially symmetrical about a longitudinal axis of the processing chamber.

5. The processing chamber of claim 3, wherein the three housings are arcuate in an X-Y plane.

6. The processing chamber of claim 3, wherein the first transparent plate is disposed between the volume and the lamps.

7. The processing chamber of claim 6, wherein the first transparent plate comprises three transparent plates.

8. The processing chamber of claim 7, wherein the three transparent plates are arcuate in an X-Y plane.

9. The processing chamber of claim 1, wherein the top further comprises a reflective plate facing the substrate support.

10. The processing chamber of claim 9, further comprising a second transparent plate disposed between the substrate support and the reflective plate.

11. The processing chamber of claim 10, wherein a channel is disposed between the reflective plate and the second transparent plate, and pressure in the channel is controlled.

12. A processing chamber, comprising:
a top, a bottom, and a sidewall coupled together to define a volume;
a gas distributor disposed around the sidewall;
a substrate support disposed in the volume, the substrate support having a central exhaust opening having a tapered interior sidewall, a channel, and a rotary actuator disposed along a rotational axis of the substrate support, and a plurality of substrate pockets distributed around the central exhaust opening;
a lower liner comprising an inner ring surrounding the central exhaust opening, and an outer ring that is coupled to the inner ring by one or more spokes;
a reflector plate disposed on the top facing the substrate support;
a plurality of lift pins fixed on a first transparent plate, each of the plurality of lift pins comprising a transparent material and each lift pin of the plurality of lift pins associated with one of the plurality of substrate pockets; and
a thermal energy source coupled to the bottom.

13. The processing chamber of claim 12, further comprising a second transparent plate disposed between the substrate support and the reflector plate.

14. The processing chamber of claim 13, wherein a channel is disposed between the reflector plate and the second transparent plate.

15. The processing chamber of claim 14, wherein a pressure in the channel is controllable.

16. A processing chamber, comprising:
a top, a bottom, and a sidewall coupled together to define a volume;
a gas distributor disposed around the sidewall;
a substrate support disposed in the volume, the substrate support having a central exhaust opening having a channel, and a rotary actuator disposed along a rotational axis of the substrate support, and a plurality of substrate pockets distributed around the central exhaust opening;
a lower liner comprising an inner ring surrounding the central exhaust opening, and an outer ring that is coupled to the inner ring by one or more spokes;
a reflector plate disposed on the top facing the substrate support;
a plurality of lift pins comprising a transparent material, each of the plurality of lift pins associated with one of the plurality of substrate pockets; and
a thermal energy source coupled to the bottom, the energy source comprising a housing containing a plurality of lamps, wherein the lift pins are fixed on a first transparent plate positioned between the thermal energy source and the substrate support.

17. The processing chamber of claim 16, wherein the housing comprises three housings, each of the three housing being at least partially surrounded by the one or more spokes of the lower liner.

18. The processing chamber of claim 17, wherein the three housings are substantially symmetrical about a longitudinal axis of the processing chamber.

19. The processing chamber of claim 17, wherein the three housings are arcuate in an X-Y plane.

20. The processing chamber of claim 16, further comprising a second transparent plate disposed between the substrate support and the reflector plate.

* * * * *